United States Patent
Loewenstein

[19]

[11] Patent Number: 6,110,838

[45] Date of Patent: Aug. 29, 2000

[54] ISOTROPIC POLYSILICON PLUS NITRIDE STRIPPING

[75] Inventor: Lee M. Loewenstein, Plano, Tex.

[73] Assignee: Texas Instruments Incorporated, Dallas, Tex.

[21] Appl. No.: 08/235,726

[22] Filed: Apr. 29, 1994

[51] Int. Cl.[7] ................................................. H01L 21/302
[52] U.S. Cl. ........................ 438/740; 438/723; 438/724; 252/79.3
[58] Field of Search ............................ 156/643.1, 646.1, 156/662.1, 651.1, 653.1, 652.1; 437/225; 438/740, 723, 724, 719; 252/79.1, 79.2, 79.3

[56] References Cited

U.S. PATENT DOCUMENTS

| | | | |
|---|---|---|---|
| 4,255,230 | 3/1981 | Zajac | 156/643.1 |
| 4,568,410 | 2/1986 | Thornquist | 156/643 |
| 4,789,426 | 12/1988 | Pipkin | 156/662 |
| 4,837,180 | 6/1989 | Chao | 156/643 |
| 4,885,054 | 12/1989 | Shibagaki | 156/643 |
| 5,047,115 | 9/1991 | Charlet et al. | 156/662 |
| 5,387,312 | 2/1995 | Keller et al. | 156/662 |
| 5,421,957 | 6/1995 | Carlson et al. | 156/643.1 |
| 5,437,765 | 8/1995 | Loewenstein | 156/643 |
| 5,560,804 | 10/1996 | Higuchi et al. | 156/643.1 |

FOREIGN PATENT DOCUMENTS

| | | |
|---|---|---|
| 60-043829 | 3/1985 | Japan . |
| 60-149136 | 8/1985 | Japan . |
| 63-090133 | 4/1988 | Japan . |
| 5-326499 | 12/1993 | Japan . |

OTHER PUBLICATIONS

"Highly Selective Etching of Silicon Nitride ($Si_3N_4$) to Silicon Dioxide Employing Fluorine and Chlorine Atoms Generated By Microwave Discharge"; Suto et al.; J. Electrochem. Soc. (1989'), 136(7); 2032–2034.

"Highly Selective Etching of Silicon Nitride Over Silicon Dioxide Employing Down Stream Type Reactor"; Solid State Tech. (1988'); 31(4); pp. 127–130; Hayasaka et al.

Primary Examiner—Benjamin Utech
Assistant Examiner—George Goudreau
Attorney, Agent, or Firm—Carlton H. Hoel; W. James Brady; Richard L. Donaldson

[57] ABSTRACT

A dry etch process for stripping LOCOS nitride masks (302) with fluorine based removal of oxynitride (312) followed by fluorine plus chlorine based removal of nitride (302) and any silicon buffer layer (303) without removal of pad oxide (304).

13 Claims, 2 Drawing Sheets

ISOTROPIC POLYSILICON PLUS NITRIDE STRIPPING

CROSS-REFERENCE TO RELATED APPLICATIONS

The following applications contain subject matter related to the present application and are assigned to the assignee of the present application: cofiled applications with Ser. Nos. 08/235,819 and 08/236,788, now U.S. Pat. No. 5,437,765.

GOVERNMENT CONTRACT

This invention was made with Government support. The Government has certain rights in this invention.

BACKGROUND OF THE INVENTION

The invention relates to electronic semiconductor devices, and, more particularly, to fabrication of silicon-based devices.

Silicon integrated circuits typically electrically isolate individual field effect transistors, bipolar transistors, and any substrate resistors and other elements with silicon dioxide ("oxide") regions at the surface of a silicon wafer. These oxide isolation regions can be directly formed by a thermal oxidation of a silicon wafer with an oxidation barrier such as silicon nitride ("nitride") masking off areas which will eventually contain transistors, substrate resistors, and other elements. This method of oxidation of selected regions of a silicon wafer has acquired the acronym LOCOS ("local oxidation of silicon"). See for example, Runyan and Bean, Semiconductor Integrated Circuit Processing Technology (Addison-Wesley 1990) pages 108–110.

Typical LOCOS includes using a thin oxide layer between the nitride mask and the silicon wafer; this oxide provides stress relief during the thermal oxidation. However, thermal oxidation of silicon proceeds essentially isotropically, and the oxidation encroaches under the nitride mask along the pad oxide to form an oxide wedge termed the "bird's beak". FIGS. 1–2 illustrate LOCOS with nitride mask 102 on pad oxide 104 which is on silicon wafer 106. FIG. 1 is prior to thermal oxidation and FIG. 2 is after thermal oxidation which forms isolation oxide 108. The bird's beak 110 growth warps nitride 102 and may also generate defects in the adjacent silicon wafer due to the stresses generated.

The bird's beak limits the scaling down and packing density of the devices in an integrated circuit. Thus attempts to reduce the extent of the bird's beak have been made and include making the pad oxide thinner and inserting a polycrystalline silicon ("polysilicon") layer between the nitride and the pad oxide ("poly buffered LOCOS" or "PBL"). FIGS. 3–4 illustrate a form of PBL with nitride mask 302 on polysilicon buffer 303 which is on pad oxide 304.

Removal of the nitride mask 102 after LOCOS thermal oxidation or nitride mask 302 after PBL thermal oxidation requires a nitride or a nitride plus polysilicon etch which will stop on the pad oxide and thereby avoid damaging the underlying device area silicon. The standard nitride etch uses a bath of hot phosphoric acid ($H_3PO_4$) which is highly selective to oxide. However, wet etches introduce undesired contamination of a wafer for two reasons: liquids typically cannot be purified sufficiently and the wafer must be removed from the oxidation chamber for the wet nitride stripping (plus pad oxide removal and cleanup) and then reinserted into a processing chamber for subsequent steps, typically a thermal oxidation to form gate oxide. An all dry processing sequence for nitride stripping can avoid the wet etch and the removal/reinsertion contamination sources.

Nitride and polysilicon can also be used in other integrated circuit processing steps which require isotropic stripping. For example, vias in an oxide insulating layer can be filled by blanket polysilicon deposition followed by an etchback. Similarly, a wafer with a nitride backside seal and a frontside deposited protective oxide may require a selective nitride strip to avoid disturbing the frontside oxide.

Suto et al, Highly Selective Etching of $Si_3N_4$ to $SiO_2$ Employing Fluorine and Chlorine Atoms Generated by Microwave Discharge, 136 JECS 2132 (1989), report the selective etching of nitride with respect to oxide with the interhalogen compound ClF. Suto et al generated the ClF by $Cl_2$ reacting with F atoms derived from an $NF_3$ plasma.

Loewenstein et al, Chemical Etching of Thermally Oxidized Silicon Nitride: Comparison of Wet and Dry Etching Methods, 138 JECS 1389 (1991), compare methods of stripping the LOCOS nitride. Note that the nitride becomes oxidized at its surface to form a silicon oxynitride during the LOCOS thermal oxidation, and thus etch selectivity with respect to oxide may slow down the nitride etch but is necessary to stop on the underlying pad oxide. Thus there is a problem of efficiently stripping nitride selectively over oxide and polysilicon and of efficiently stripping polysilicon selectively over oxide and nitride.

SUMMARY OF THE INVENTION

The present invention provides dry isotropic etches for silicon nitride, (poly)silicon, and silicon oxynitrides based on oxygen and/or nitrogen control gasses added to fluorine plus chlorine etch gasses to adjust selectivites as needed.

This has advantages including the totally dry stripping of the oxdiation masks in local oxidation of silicon by sequential use of these etches.

BRIEF DESCRIPTION OF THE DRAWINGS

The drawings are schematic for clarity.

DESCRIPTION OF THE PREFERRED EMBODIMENTS

Overview

The preferred embodiments include isotropic dry etches based on remote plasma generated speices of fluorine and chlorine (from sources such as $NF_3$ and $Cl_2$) with added nitrogen and/or oxygen to control selectivity and etch rates. Such etches can strip silicon nitride ("nitride") selectively with respect to polysilicon and silicon dioxide ("oxide"), strip polysilicon plus nitride selectively with respect to oxide, strip polysilicon selectively with respect to nitride and oxide, and strip silicon oxynitrides. This permits removal of the various oxidation masking materials used in local oxidation of silicon; namely, silicon nitride, silicon oxynitrides, and polysilicon. The various materials may be stripped sequentially without removal of a wafer from the etcher; this lessens particulate contamination.

Figure 1:
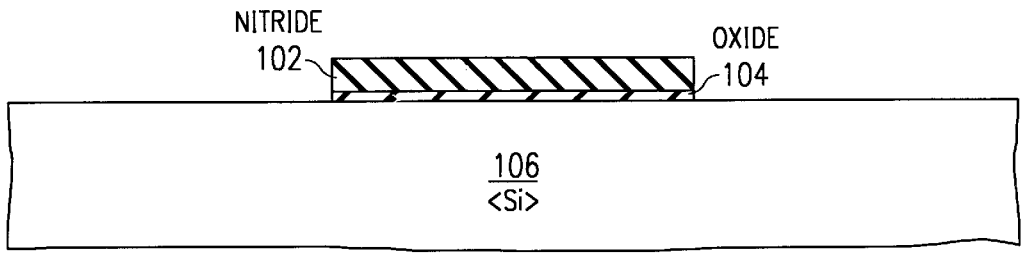
FIGS. 1–2 illustrate LOCOS in cross sectional elevational views.
Figure 2:
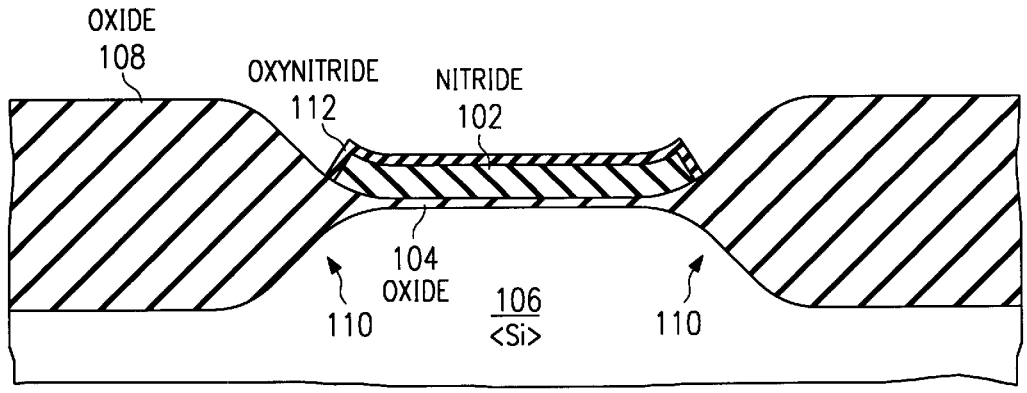
Figure 3:
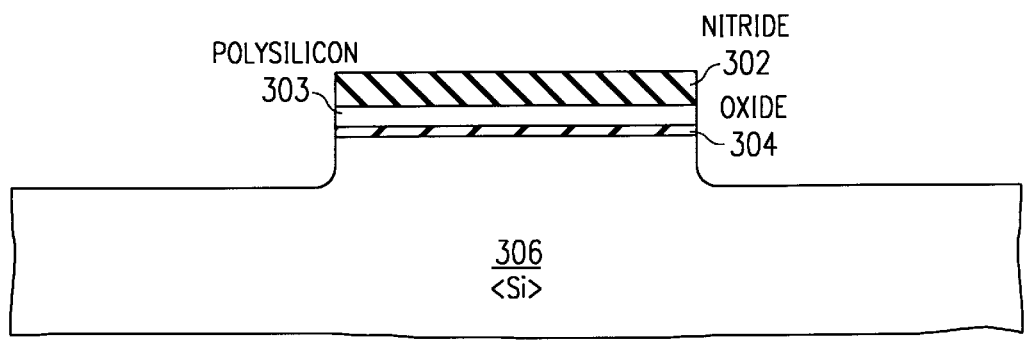
FIGS. 3–4 show polysilicon buffered LOCOS (PBL) in cross sectional elevational views.

FIG. 1 shows in cross sectional elevation view a portion of silicon wafer 106 with a nitride mask 102 and pad oxide 104 prior to LOCOS thermal oxidation, and FIG. 3 shows the corresponding view for polysilicon buffered LOCOS (PBL) with recessed isolation oxide. In particular, FIG. 3 shows mask nitride 302 on polysilicon buffer layer 303 on pad oxide 304 with silicon wafer 306 recessed away from this nitride-polysilicon-oxide stack. Note that nitride thicknesses typically are on the order of 0.1–0.3 μm (1000–3000 Å), polysilicon (if used) on the order of 0.05–0.1 μm (500–1000 Å), and pad oxide on the order of 0.01 μm (100 Å). After thermal oxidation, the unbuffered, unrecessed LOCOS of FIG. 1 looks like FIG. 2 and the buffered, recessed PBL of FIG. 3 looks like FIG. 4. Note that in both cases the exposed surface of nitride 102, 302 is oxidized to silicon oxynitride ($SiO_xN_y$) 112, 312. The composition of the oxynitride varies; the oxygen fraction decreases in a direction from the surface to the interior.

For the LOCOS of FIG. 2, nitride 102 plus oxynitride 112 must be removed without also removing oxide 104 and attacking silicon 106. Similarly, for the PBL of FIG. 4, first oxynitride 312, then nitride 302, and lastly polysilicon 303 must be removed without disturbing underlying silicon 306. The preferred embodiments employ a dry etch in a single chamber with a remote plasma source to generate active etch species but without ion impact and radiation which occurs in plasma etches. Indeed, removal of the oxynitride 112 and 312 require an isotropic etch due to their roughly vertical sidewall portions, so the directionality of a plasma or reactive ion etch should be avoided. And selectivity is needed because nonuniformities demand an overetch to insure clearance.

Figure 5:
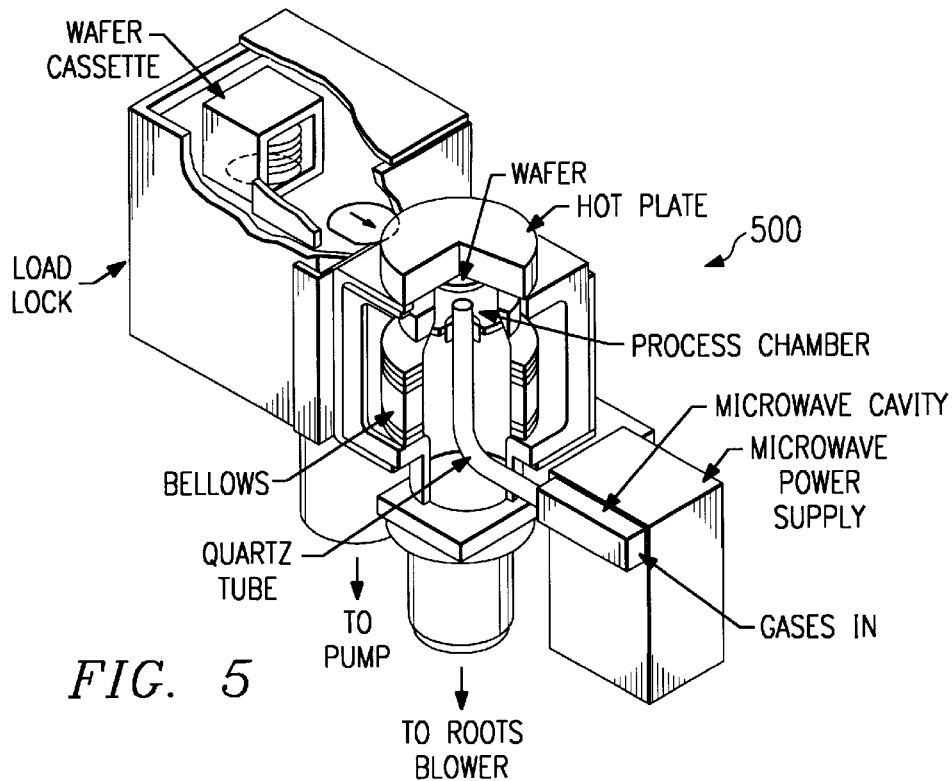
FIG. 5 is a perspective view of a remote plasma reactor.

FIG. 5 illustrates remote plasma reactor 500 which can use the preferred embodiment etch chemistries. Note that reactor 500 can handle wafers up to 8 inches in diameter and has a cylindrical process chamber of roughly 15 cm high by 20 cm diameter. An alternative to the hotplate heater shown in FIG. 5 would be an array of lamps to form a rapid thermal heater. The quartz tube from the plasma (inside the microwave cavity) to the wafer has a length of about 25 cm and an inside diameter of about 2.5 cm.

Stripping the oxidation mask of the LOCOS of FIG. 2 starts with an oxynitride etch using $NF_3$ plus $O_2$ and then applies a nitride etch using $NF_3$, $Cl_2$, $O_2$, and $N_2$ which is highly selective to oxide so pad oxide 104 can be preserved during overetch. Stripping the oxidation mask stack of the PBL of FIG. 4 also starts with the oxynitride etch of $NF_3$ plus $O_2$, next applies a nitride etch using $NF_3$, $Cl_2$, $O_2$, and $N_2$ which is somewhat selective to polysilicon, and lastly applies a polysilicon etch with the same gasses as the nitride etch but in different ratios to be selective to nitride and highly selective to oxide. The switching from one etch to the next amounts to adjusting the flow of gasses into reactor 500, and either end point detection or just timing determines the flow adjustments. Details of these etches appear in the following sections.

Selective Isotropic Nitride Etch

The first preferred embodiment nitride etch begins with a wafer at a cool room temperature (15° C.) in the process chamber of a remote plasma reactor as illustrated in FIG. 5. Then set a gas flow of 50 sccm (standard cubic centimeters per second) $NF_3$, 25 sccm $Cl_2$, 1500 sccm $O_2$, and 1000 sccm $N_2$ into the microwave cavity for excitation, and maintain a process chamber total pressure of 2.0 Torr. Set the microwave power level to 1300 watts at 2.45 GHz; this dissociates some of the $NF_3$ to yield atomic fluorine plus radicals such as NF and $NF_2$, and dissociates some of the $Cl_2$, $N_2$, and $O_2$ to yield atomic chlorine, atomic nitrogen, and atomic oxygen. Then transport these species to the wafer for isotropic etching.

This nitride etch is selective with respect to oxide in that the etch rate for nitride is 7.17 Å/sec and the etch rate for oxide is 0.49 Å/sec. Thus the etch rates have a ratio of about 15 to 1. And the etch is also somewhat selective with respect to polysilicon in that the etch rate for polysilicon is 2.62 Å/sec, so the etch rates have a ratio of about 3 to 1.

A second embodiment isotropic nitride etch increases the nitrogen flow by ten percent and thereby increases the selectivity without greatly decreasing the etch rate. In particular, set a gas flow of 50 sccm $NF_3$, 25 sccm $Cl_2$, 1500 sccm $O_2$, and 1100 sccm $N_2$ into the microwave cavity with 1200 watts excitation, and again maintain a process chamber total pressure of 2.0 Torr and a wafer temperature of 15° C. This changes the etch rate for nitride to 6.5 Å/sec, the etch rate for oxide to 0.3 Å/sec, and the etch rate for polysilicon to 1.4 Å/sec. Thus the selectivity with respect to oxide is about 22 to 1, and the selectivity with respect to polysilicon is greater than 4.5 to 1.

However, if there is no polysilicon exposed, and only the selectivity with respect to oxide is needed, then the gas mixture can be adjusted to increase the nitrogen, chlorine, and fluorine and decrease the oxygen to a gas flow of 200 sccm $NF_3$, 275 sccm $Cl_2$, 680 sccm $O_2$, and 2200 sccm $N_2$ while maintaining a process chamber total pressure of 2.0 Torr. Again, the gas mixture is excited with 1300 watts of 2.45 GHz power, and the resulting species transported to the wafer which is at 15° C. This etches nitride at 16.8 Å/sec and oxide at 0.4 Å/sec. Thus the etch rates have a ratio of about 40 to 1. Note that the etch rate for with this gas for polysilicon is 150.6 Å/sec, and thus may be used as a selective polysilicon etch.

Once the nitride has cleared, a drop in effluent silicon compounds can be used as an endpoint detection to terminate the etch.

Selective Isotropic Polysilicon Plus Nitride Etch

The first preferred embodiment polysilicon plus nitride etch begins with a wafer at a cool room temperature (15° C.) in the process chamber of a remote plasma reactor as illustrated in FIG. 5. Then set a gas flow of 200 sccm $NF_3$, 275 sccm $Cl_2$, 680 sccm $O_2$, and 2200 sccm $N_2$ into the microwave cavity for excitation, and maintain a process chamber total pressure of 2.0 Torr. Set the microwave power level to 1300 watts at 2.45 GHz; this dissociates some of the $NF_3$ to yield atomic fluorine plus radicals such as NF and $NF_2$, and dissociates some of the $Cl_2$, $N_2$, and $O_2$ to yield atomic chlorine, atomic nitrogen, and atomic oxygen. Then transport these species to the wafer for isotropic etching.

This etch is selective for polysilicon with respect to oxide in that the etch rate for polysilicon is 150.6 Å/sec and the etch rate for oxide is 0.40 Å/sec. Thus the etch rates have a ratio of about 375 to 1. And the etch is also selective for nitride with respect to oxide in that the etch rate for nitride is 16.8 Å/sec, so the etch rates have a ratio of about 40 to 1. Also, the ratio of the polysilicon etch rate to the nitride etch rate is about 9 to 1, so the etch could be used as a polysilicon etch selective to both oxide and nitride.

Another embodiment polysilicon etch which is selective for oxide derives from decreasing the gas flows as follows: set a gas flow of 100 sccm $NF_3$, 30 sccm $Cl_2$, 0 sccm $O_2$, and 1100 sccm $N_2$ into the microwave cavity for excitation at 1200 watts, and again maintain a process chamber total pressure of 2.0 Torr and a wafer temperature of 15° C. This yields an etch rate for polysilicon of 80 Å/sec and an etch rate for oxide of 0.2 Å/sec. Thus the etch has a selectivity of about 400 to 1.

Once the polysilicon has cleared, a drop in effluent silicon compounds can be used as an endpoint detection to terminate the etch.

Oxynitride-nitride-oxide Stack

FIG. 2 shows in cross sectional elevation view an enlarged portion of a LOCOS oxidation mask after thermal oxidation. Note that oxynitride layer 112 thickness and composition may vary for a given thickness of isolation field oxide 108 because the thermal oxidation may be performed in various ways which give rise to differing oxynitride layers. In particular, higher temperature and higher pressure thermal oxidation generally gives a relatively oxygen richer and thicker oxynitride layer, although for sufficiently high temperatures and pressures the field oxide may be formed so quickly that oxygen does not have time to diffuse too deeply into the nitride.

The first preferred embodiment etch of the oxynitride plus nitride and stopping on pad oxide 104 proceeds in two steps in the same reactor 500. The oxynitride etch, which necessarily must etch oxide due to the possibility of fairly high oxygen content in the oxynitride, uses a wafer temperature of 250° C. and a total process chamber pressure of 4.5 Torr and the following gas flows: $NF_3$ at 100 sccm plus $O_2$ at 4000 sccm. For reactor 500 apply about 1200 watts of microwave power (at 2.45 GHz) to dissociate $NF_3$ to yield atomic fluorine plus radicals such as NF and $NF_2$, and dissociate $O_2$ to yield atomic oxygen. Then transport these species to wafer 106 for thermal etching. This chemistry etches oxide at about 12.2 Å/sec, nitride at about 16.7 Å/sec, and oxynitride at comparable rates depending upon the composition.

This chemistry also etches polysilicon at about 10.3 Å/sec, so the etch could remove oxynitride 112, all of nitride 102, pad oxide 104, plus some of silicon wafer 106 if not timely terminated. Because the exposed portions of field oxide 108 are also being removed, endpoint detection by a drop in oxide etch products cannot be used. However, knowledge of the thermal oxidation process parameters (time, temperature, pressure, and oxidizing ambient) gives an estimate of the thickness of oxynitride 112. For example, a thermal oxidation producing a 0.8 μm thick field oxide will generate oxynitride roughly from 200 to 400 Å thick for conditions of 850° C. at atmospheric pressure to 975° C. at 25 atmospheres pressure. See the Loewenstein article cited in the Background. Thus the oxynitride will typically be much thinner than the underlying nitride 102, and the oxynitride etch can easily be stopped in nitride 102. Typically, 25–30 seconds of etch would clear 150–200 Å of oxynitride with an overetch.

Once oxynitride 112 has been totally removed (overetch), drop the temperature of wafer 106 to about a cool room temperature (15° C.) and switch to a gas flow of 200 sccm $NF_3$, 275 sccm $Cl_2$, 680 sccm $O_2$, and 2200 sccm $N_2$ with a process chamber total pressure of 2.0 Torr. During the cooling down from the oxynitride etch temperature to the nitride etch temperature, flow only nitrogen, which acts as an inert carrier gas. Raise the microwave power level to 1300 watts for the nitride etch. This nitride etch is selective with respect to oxide in that the etch rate for nitride is 16.8 Å/sec and the etch rate for oxide is 0.4 Å/sec. Thus the etch has a ratio of more than 40 to 1. And once the nitride has cleared, a drop in effluent silicon compounds can be used as an endpoint detection to terminate the etch.

This etch removes 2000 Å of nitride with a 10% overetch in about 130 seconds, and the 10% overetch should only remove about 5 Å of underlying pad oxide 104. Thus the mask nitride is removed without exposure of the underlying silicon 106 by a dry process in a single chamber.

Oxynitride-nitride-poly-oxide Stack

Figure 4:
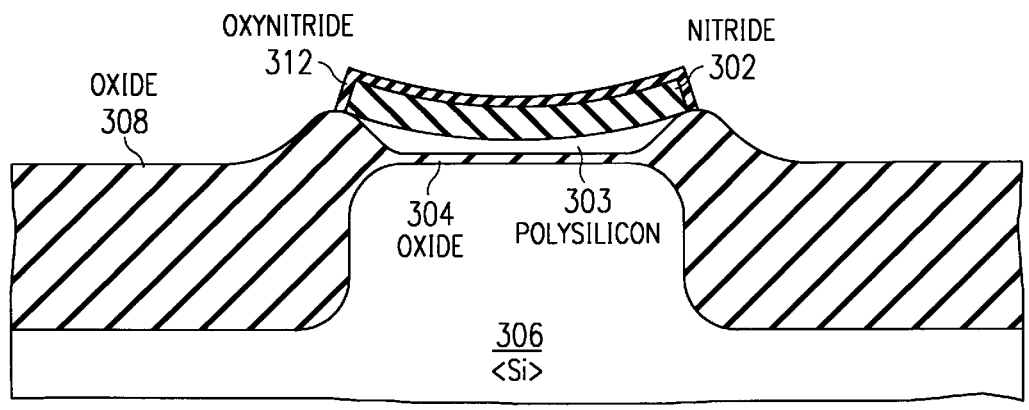

FIG. 4 shows in cross sectional elevation view an enlarged portion of a polysilicon buffered LOCOS oxidation mask after thermal oxidation. Note that the oxynitride layer 312 thickness and composition again may vary for a given thickness of isolation field oxide 308 because the thermal oxidation may be performed in various ways which give rise to differing oxynitride layers.

The second preferred embodiment etch of the oxynitride, nitride, plus polysilicon and stopping on pad oxide 304 proceeds in three steps in the same reactor 500. The oxynitride etch, which necessarily must etch oxide due to the possibility of fairly high oxygen content oxynitride, uses a wafer temperature of 250° C. and a total process chamber pressure of 4.5 Torr and the following gas flows: $NF_3$ at 100 sccm (standard cubic centimeters per second) plus $O_2$ at 4000 sccm. For reactor 500 apply about 1200 watts of microwave power (2.45 GHz) to dissociate $NF_3$ to yield atomic fluorine plus radicals such as NF and $NF_2$, and dissociate $O_2$ to yield atomic oxygen. This chemistry etches oxide at about 12.2 Å/sec, nitride at about 16.7 Å/sec, oxynitride at comparable rates depending upon the composition, and polysilicon at 10.3 Å/sec.

Again, knowledge of the thermal oxidation process parameters gives an estimate of the thickness of oxynitride 312. The oxynitride will typically be much thinner than the underlying nitride 302, and the oxynitride etch can easily be stopped in nitride 302. Typically, 25–30 seconds of etch would clear 150–200 Å of oxynitride with an overetch.

Once oxynitride 312 has been totally removed (overetch), drop the temperature of wafer 306 to about 15° C. and switch to a gas flow of 50 sccm $NF_3$, 25 sccm $Cl_2$, 1500 sccm $O_2$, and 1000 sccm $N_2$ with a process chamber total pressure of 2.0 Torr. During the cooling down from the oxynitride etch temperature to the nitride etch temperature, flow only nitrogen, which acts as an inert carrier gas. Set the microwave power level at 1300 watts for the nitride etch. This nitride etch is selective with respect to oxide in that the etch rate for nitride is 7.2 Å/sec and the etch rate for oxide is 0.5 Å/sec; but the etch rate for polysilicon is 2.6 Å/sec, so the selectivity with respect to polysilicon is only about 3 to 1. However, polysilicon buffer layer 303 has a thickness 500 Å and thus stops the nitride etch even with a 10% overetch of a 2500 Å thick nitride 302. Indeed, a 10% overetch of 2500 Å of nitride takes about 380 seconds and removes only about 100 Å of polysilicon 303.

Alternatively, the nitride could be stripped with a slower but more selective etch as follows. Again, after the oxynitride strip, lower the temperature to 15° C. and process chamber pressure to 2.0 Torr and switch to a gas flow of 50 sccm NF$_3$, 25 sccm Cl$_2$, 1500 sccm O$_2$, and 1100 sccm N$_2$ and 1200 watts of microwave power. This nitride etch removes nitride at 6.5 Å/sec, oxide at 0.3 Å/sec, and polysilicon at 1.4 Å/sec, so the selectivity with respect to oxide is about 22 to 1 and with respect to polysilicon is about 4.5 to 1. Thus stopping in the polysilicon is easier than with the previous nitride etch.

After the nitride etch, switch the gas flow to 200 sccm NF$_3$, 275 sccm Cl$_2$, 680 sccm O$_2$, and 2200 sccm N$_2$ with a process chamber total pressure remaining at 2.0 Torr for a polysilicon etch. This polysilicon etch is selective with respect to oxide (and nitride) in that the etch rate for polysilicon is 151 Å/sec, whereas the etch rate for oxide is 0.4 Å/sec (and the nitride etch rate is 16.8 Å/sec). Thus the etch has a ratio of more than 300 to 1 with respect to oxide (and 9 to 1 respect to nitride). And once the polysilicon 303 has cleared, a drop in effluent silicon compounds can be used as an endpoint detection to terminate the etch. Note that this same etch was used to strip nitride 102 in the oxynitride-nitride-oxide stack embodiment due to the very low oxide etching rate.

This etch removes 500 Å of polysilicon with a 100% overetch in about 7 seconds, which would only remove 3 Å of pad oxide 304.

Alternatively, the slower but more selective polysilicon etch could be used as follows. Again after the nitride etch, switch the gas flow to 100 sccm NF$_3$, 30 sccm Cl$_2$, 0 sccm O$_2$, and 1100 sccm N$_2$ with a process chamber total pressure again remaining at 2.0 Torr and wafer temperature at 15° C. Then etch rate for polysilicon is 80 Å/sec, whereas the etch rate for oxide is 0.2 Å/sec for a selectivity of about 400 to 1.

Composition Variations

Figure 6:
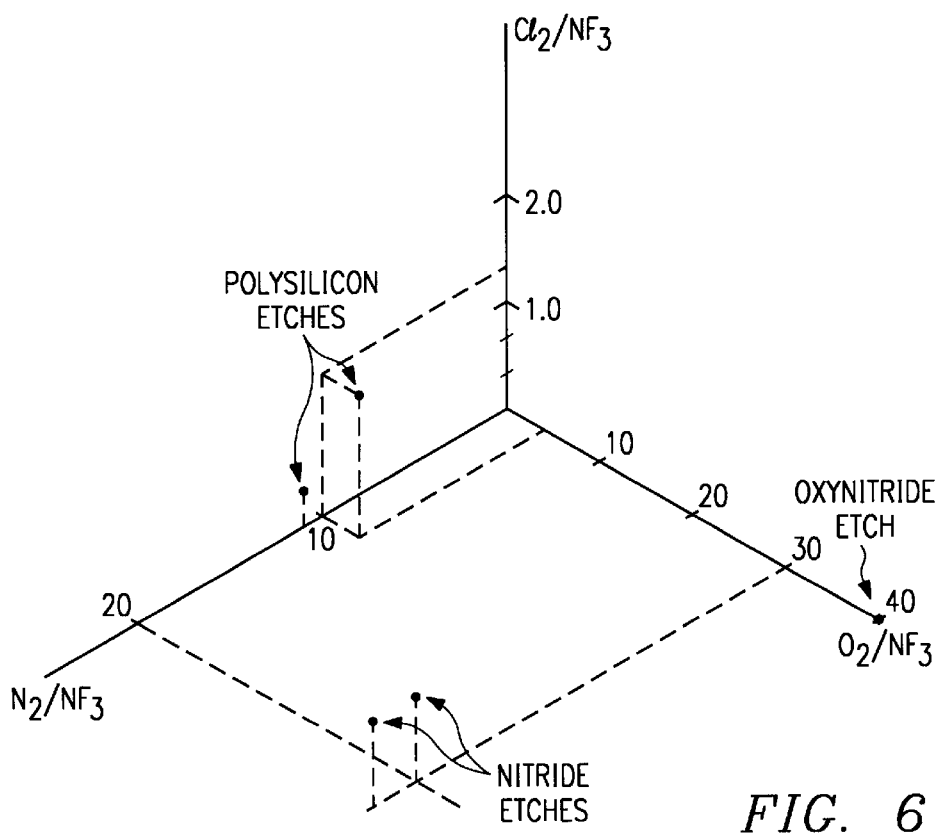
FIG. 6 illustrates preferred embodiment etch chemistries.

FIG. 6 illustrates the preferred embodiment etches as functions of the oxygen to fluorine ratio, the nitrogen to flourine ratio, and the chlorine to fluorine ratio. Perturbations in the etch compositions and conditions will yield etches which still provide most of the etch selectivities and rates as the preferred embodiments. In particular, the oxygen and nitrogen control gas flows may be adjusted to vary the etch rates and still maintain selectivities such as nitride to oxide of at least 10 to 1 together with nitride to polysilicon of at least 2 to 1, or polysilicon to oxide of at least 100 to 1 together with nitride to oxide of at least 20 to 1, or polysilicon to oxide of at least 100 to 1 together with polysilicon to nitride of at least 5 to 1.

Various compounds may be substituted for the foregoing ingredients. In particular, other sources of atomic fluorine, such as SF$_6$, F$_2$, CF$_4$, and so forth may be used in place of or in addition to the NF$_3$. However, fluorocarbons should be avoided in oxygen-deficient environments to prevent formation of polymers. Similarly, other sources of chlorine such as HCl, NCl$_3$, may be used, although such sources would generate atomic chlorine and thus not as rapid reaction with fluorine if the primary reaction were something like F+Cl$_2$→ClF+Cl. Of course, compounds such as ClF and ClF$_3$ could be directly used. Other sources of oxygen and nitrogen could include NO$_2$, O$_3$, and so forth; the oxygen provides an oxidizer and nitrogen provides a carrier gas. Inert carrier gasses such as He, Ar, . . . could be used. Further, bromine or iodine in place of chlorine will also suffice because BrF and IF also would not dissociate on oxide. With other halogens substituted for chlorine, compounds such as BrF$_3$, BrF$_5$, IF$_5$, . . . could be used directly, or Br$_2$ replacing Cl$_2$, or even a mixture of both Cl and Br compounds.

Modifications

The preferred embodiments may be varied in many ways while retaining one or more of the features of a dry isotropic etch of nitride and/or (poly)silicon relative to oxide based on oxygen and/or nitrogen addition to a fluorine-chlorine etch for control of the etch selectivities.

For example, the pressure and temperature in the process chamber could be varied; the gas flow, the excitation power, the excitation frequency, and the degree of dissociation could be varied, indeed, multiple excitation power sources with differing frequencies and magnetic confinement fields could be used. The degree of reaction among the excited species could be adjusted by changing the length of the transport path from the excitation location to the process chamber.

What is claimed is:

1. A method of dry etching polysilicon plus silicon nitride, comprising the steps of:
   (a) exposing polysilicon plus silicon nitride to a gas mixture including fluorine and chlorine sources plus a control gas selected from the group consisting of an oxygen source, a nitrogen source, and a mixture thereof, whereby said polysilicon plus silicon nitride is removed.

2. The method of claim 1, wherein:
   (a) said gas mixture of step (a) of claim 1 is excited in a plasma remote from said polysilicon and silicon nitride.

3. The method of claim 1, wherein:
   (a) said gas mixture of step (a) of claim 1 contains more oxygen than flourine.

4. The method of claim 1, wherein:
   (a) said gas mixture of step (a) of claim 1 contains more nitrogen than fluorine.

5. The method of claim 1, wherein:
   (a) the ratios of nitrogen to fluorine and oxygen to fluorine are both greater than the ratio of chlorine to fluorine in said gas mixture.

6. The method of claim 1 with said polysilicon and silicon nitride adjacent silicon oxide, wherein:
   (a) said gas mixture removes polysilicon at a rate of at least 100 times the rate it removes silicon oxide; and
   (b) said gas mixture removes silicon nitride at a rate of at least 20 times the rate it removes silicon oxide.

7. The method of claim 6, wherein:
   (a) said gas mixture is excited in a remote plasma; and
   (b) said gas mixture included NF$_3$ as a fluorine source, Cl$_2$ as a chlorine source, N$_2$ as a nitrogen source, and O$_2$ as an oxygen source.

8. The method of claim 7, wherein:
   (a) the ratio of N$_2$ to NF$_3$ and the ratio of O$_2$ to NF$_3$ are both at least 2 times the ratio of Cl$_2$ to NF$_3$.

9. A dry etch mixture for etching polysilicon, comprising:
(a) activated species from a remote excitation of a mixture of a fluorine source, a chlorine source, a nitrogen source, and an oxygen source, wherein said nitrogen source plus said oxygen source is at least about 85% of said mixture.

10. The etch mixture of claim 9, wherein:
(a) said flourine source includes $NF_3$, said chlorine source includes $Cl_2$, said nitrogen source includes $N_2$, and said oxygen source includes $O_2$.

11. The etch mixture of claim 10, wherein:
(a) the ratio of $N_2$ to $NF_3$ and the ratio of $O_2$ to $NF_3$ are both at least 2 times the ratio of $Cl_2$ to $NF_3$.

12. The etch mixture of claim 9 with said polysilicon adjacent silicon nitride and silicon oxide, wherein:

(a) said activated species remove polysilicon at a rate of at least 100 times the rate they remove silicon oxide; and
(b) said activated species remove polysilicon at a rate of at least 5 times the rate they remove silicon nitride.

13. A method of etching polysilicon, comprising the steps of:
(a) exposing polysilicon to a gas mixture including fluorine and chlorine sources plus a control gas which includes a nitrogen source, and an oxygen source, wherein said control gas is at least about 85% of said gas mixture.

* * * * *